US010488028B2

(12) United States Patent
Duong et al.

(10) Patent No.: US 10,488,028 B2
(45) Date of Patent: Nov. 26, 2019

(54) SYSTEMS AND METHODS FOR A HEAT SINK

(71) Applicant: Fluence Bioengineering, Austin, TX (US)

(72) Inventors: Dung Duong, Austin, TX (US); Randall Johnson, Austin, TX (US); Nicholas Klase, Austin, TX (US)

(73) Assignee: Fluence Bioengineering, Inc., Austin, TX (US)

( * ) Notice: Subject to any disclaimer, the term of this patent is extended or adjusted under 35 U.S.C. 154(b) by 2 days.

(21) Appl. No.: 15/636,923

(22) Filed: Jun. 29, 2017

(65) Prior Publication Data

US 2018/0320878 A1 Nov. 8, 2018

Related U.S. Application Data

(60) Provisional application No. 62/500,945, filed on May 3, 2017.

(51) Int. Cl.
| | | |
|---|---|---|
| *F21V 29/74* | (2015.01) | |
| *F21V 29/75* | (2015.01) | |
| *F21V 29/76* | (2015.01) | |
| *F21V 29/67* | (2015.01) | |
| *F21V 29/502* | (2015.01) | |
| *F21V 23/00* | (2015.01) | |
| *H05K 7/20* | (2006.01) | |
| *F28F 3/02* | (2006.01) | |
| *H01L 23/367* | (2006.01) | |
| *H05K 1/02* | (2006.01) | |
| *F21V 29/83* | (2015.01) | |
| *A01G 9/20* | (2006.01) | |
| *H05K 1/05* | (2006.01) | |
| *H05K 3/00* | (2006.01) | |

(Continued)

(52) U.S. Cl.
CPC .............. *F21V 29/502* (2015.01); *A01G 9/20* (2013.01); *F21V 23/009* (2013.01); *F21V 29/745* (2015.01); *F21V 29/75* (2015.01); *F21V 29/76* (2015.01); *F21V 29/763* (2015.01); *F21V 29/83* (2015.01); *F28F 3/02* (2013.01); *H01L 23/367* (2013.01); *H05K 1/021* (2013.01); *H05K 7/20409* (2013.01); *A01G 9/26* (2013.01); *F21V 19/0055* (2013.01); *F21V 29/67* (2015.01); *F21W 2131/40* (2013.01); *F21Y 2103/10* (2016.08); *F21Y 2115/10* (2016.08); *F28D 2021/0029* (2013.01); *F28F 3/025* (2013.01); *H05K 1/05* (2013.01); *H05K 3/0061* (2013.01)

(58) Field of Classification Search
CPC ......... F21V 29/70; F21V 21/005; F21V 29/89
USPC ........................................ 362/218
See application file for complete search history.

(56) References Cited

U.S. PATENT DOCUMENTS

| | | | | |
|---|---|---|---|---|
| 2006/0139945 | A1* | 6/2006 | Negley | ............ G02F 1/133603 362/600 |
| 2014/0318153 | A1* | 10/2014 | Ilercil | ..................... F25B 21/04 62/3.3 |
| 2015/0300610 | A1* | 10/2015 | DeCarr | .................. F21S 8/061 362/249.07 |

\* cited by examiner

*Primary Examiner* — William J Carter
(74) *Attorney, Agent, or Firm* — Yutian Ling

(57) ABSTRACT

Embodiments may utilize a series of exposed fins, which increase the surface area of the heat sink creating additional air flow. As hotter air rises within the system, cooler is drawn into the heatsink. The fins may be exposed on both sides of the longitudinal axis, allowing cooler air to be drawn towards the longitudinal axis above the heatsink and flow upward. This process may cool the fins. Additionally, the spacing between the fins may have to be wide enough to allow for air to freely enter the heatsink.

16 Claims, 5 Drawing Sheets

(51) Int. Cl.
*A01G 9/26* (2006.01)
*F28D 21/00* (2006.01)
*F21W 131/40* (2006.01)
*F21Y 103/10* (2016.01)
*F21Y 115/10* (2016.01)
*F21V 19/00* (2006.01)

SYSTEMS AND METHODS FOR A HEAT SINK

CROSS-REFERENCE TO RELATED APPLICATIONS

This application claims a benefit of priority under 35 U.S.C. § 119 to Provisional Application No. 62/500,945 filed on May 3, 2017, which is fully incorporated herein by reference in their entirety.

BACKGROUND INFORMATION

Field of the Disclosure

Examples of the present disclosure are related to systems and methods for a heat sink. More particularly, embodiments disclose a heat sink configured to dissipate heat caused by a light fixture, wherein the heat sink includes exposed fins that allow for additional air flow.

Background

Greenhouses are buildings or complexes in which plants are grown. For various reasons including price, it is typically ideal for greenhouses to operate with as much natural sunlight as possible. To supplement natural light from the sun, high powered lights are used within greenhouses when the sun or other natural light does not provide enough light for optimal plant growth.

However, the operation of the high powered lights is more costly than utilizing free sunlight. More so, conventional high powered lights are larger in size, which blocks the incoming free sunlight. Furthermore, the blocking of the incoming sunlight causes shading on the plants within the greenhouse, which negatively impacts the grower's productivity.

Although light emitting diodes (LEDs) are more efficient than traditional high powered lights, their manufacturing costs are higher. Additionally, the LEDs cause excessive shading based on requiring larger fixtures to dissipate heat. To circumvent the large fixtures required to dissipate the heat, some manufacturers have attempted to build smaller LED fixtures that use active cooling fans. However, in greenhouse environments, active cooling fans quickly clog with dirt, bugs, etc. This causes the LED fixtures with active cooling fans to quickly become inoperable.

Conventional LED fixtures that do not include active cooling fans use traditional linear heat sinks. However, traditional linear heat sinks include wings that extend in a direction parallel with a central axis of the conventional LED fixtures. Heat generated through conventional LED fixtures may dissipate based on convection, conduction or radiation. However, due to LED fixtures being suspended, there is minimal heat dissipation via conduction. Radiation is a function of the fixture temperature and may be significant, and convection is the primary method to dissipate heat. In applications, air particles remove heat from the fixture through air movement. For longer heat sinks, air movement within the middle of the fixtures is minimal. This severely limits the amount of power conventional LED fixtures can consume because additional power consumption leads to more heat.

Accordingly, needs exist for more effective and efficient systems and methods for heat sinks with exposed fins allowing for additional air flow.

SUMMARY

Embodiments disclosed herein describe systems and methods for heat sinks within light fixtures. In embodiments, a heat sink may be a passive system that continually and passively creates a cross-flow thermal management system dissipating large amounts of heat in a slim light fixture.

Embodiments may utilize a series of extruded and exposed fins that increase the surface area of the heat sink creating additional air flow. As hotter air rises within the system, cooler is drawn into the heatsink. The fins may have exposed sides, lower surfaces, and upper surfaces. The exposed and unobstructed surfaces may allow cooler air to be drawn towards the central axis of the light fixture above the light source, and then flow upward. This process may cool the fins by passively drawing cooler air within a body of the light fixture. Additionally, the spacing between the fins may be wide enough to allow for air to freely enter the heatsink.

Embodiments may include systems having extrusions to create the plurality of fins from an aluminum block. Aluminum rails may be affixed directly to the sides and/or lower surfaces of the plurality of fins. By creating the plurality of fins via extrusions and directly coupling the aluminum rails to the fins, no secondary operations may be required to create the heat sink. Additionally, while the fins are being extruded, a base may simultaneously formed below the fins. The base and fins may be created by passing the unitary block of metal through a die, wherein the base portions of the die does not include fin extrusions.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
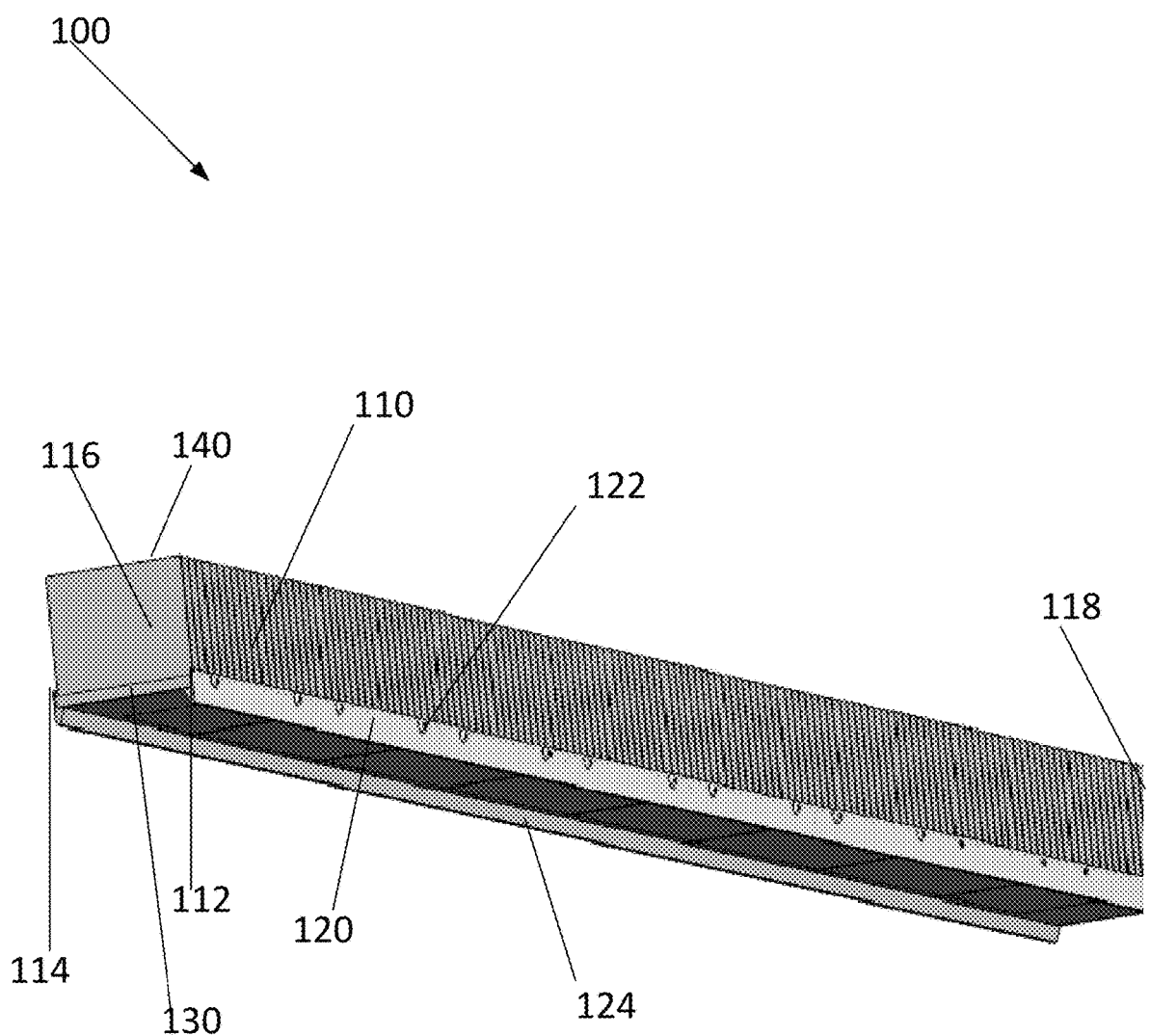
FIG. 1 depicts a cross flow heat sink, according to an embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

Embodiments may utilize a series of exposed fins that increase the surface area of the heat sink creating additional air flow. The fins may be exposed on both sides of a central axis of the heat sink and an upper surface of the heat sink. This allows cooler air to be drawn internally towards the central axis of the heatsink, above the heat source, and flow upward and out of the heat sink. This process may cool the fins by passively moving cooler air into the body of the heat sink. Additionally, the spacing between the fins may be wide enough to allow for air to freely enter the heatsink via the sides of the fins and/or through exposed lower surfaces of the fins.

FIG. 1 depicts a cross flow heat sink 100, according to an embodiment. Cross flow heat sink 100 may be configured to dissipate heat from a heat source, such as a light fixture, wherein the light fixture may be positioned under heat sink 100. In a conventional linear heat sink, the heat generated from the heat source flows around a solid heat sink. In cross flow heat sink 100, the generated heat may be configured to flow through fins 110, and into spaces between fins 110. This may more rapidly and efficiently dissipate the generated heat. Heat sink 100 may include fins 110 and rails 120.

Fins 110 may be extrusions from a unitary block of metal, such as aluminum. The extrusions consist of fins extending from an upper surface 140 of the unitary block of metal towards or to base 130, wherein the extrusions may be formed by inserting the unitary block of metal through a die that include fin portions. Remaining portions of the unitary block of metal may form fins 110 via the negative of the die. In other embodiments, the extrusions to fins 110 may extend from a first edge 112 to a second edge 114 of heat sink 100. As such, the extrusions may form fins that extend across the central axis of heat sink 100. In embodiments, the extrusions may create fins extending from first edge 112 to second edge 114. The extrusions may cause a plurality of evenly spaced fins 110 from a first end 116 to a second end 118 of heat sink 100. For example, each extrusion may cause fins 110 to be ⅙ of inch spaced from each other. However, in other embodiments fins 110 may have different even spacing, such as ⅓ spacing, ¼ inch spacing, etc.

Fins 110 may have planar edges 112, 114, 140. Accordingly, sides of fins 110 extend in a direction perpendicular to the central axis of heat sink 100, and the upper surface 140 of fins 110 extend in a direction that is perpendicular to planar edges 112, 114. In other embodiments, fins 110 may have tapered edges, such that the width across fins decreases from a bottom to top surface of fins 110. Furthermore, the edges 112, 114, 140 of fins 110 may be contoured to include ridges, grooves, projections, etc. to create air turbulence.

Additionally, the contoured edges may increase the surface area associated with fins 110 contacting the moving air, allowing for more effective air flow through heat sink 100. More specifically, as the amount of surface area associated with fins 110 increases, more surface area of fins 110 may interact with the moving air, which may cool the fins 110.

Base 130 may be formed simultaneously with the fins 110 by inserting the unitary block of metal through the die. The die may include base portion of the die may be positioned below the fin portions of the die and may not include extrusions from the first end of the die to the second end of the die. As such, a lower surface of the block of metal may remain. Accordingly, a secondary operation may not be required to create base 130. A plurality of bases 130 may be positioned adjacent to each other to extend from first end 116 to second end 118 of heat sink 100. This may be utilized to couple the plurality of fins 110 together. By positioning a plurality of bases 130 adjacent to each other, a continuous planar surface may be formed.

Rails 120 may be coupled to base 130 via coupling mechanisms, such as screws 122, fasteners, etc. In embodiments, rails 120 may be bonded to base 130 via welding, adhesives, coupling mechanism, and/or any other type of fastening scheme. Rails 120 may extend from first end 116 to second end of heat sink 118. Rails 120 may be configured to add rigidity and support for fins 110. Rails 120 may include planar external sidewalls, and tapered internal sidewalls 124. The internal sidewalls 124 may extend outward from a position below base 130 to the planar external sidewalls.

Figure 2:
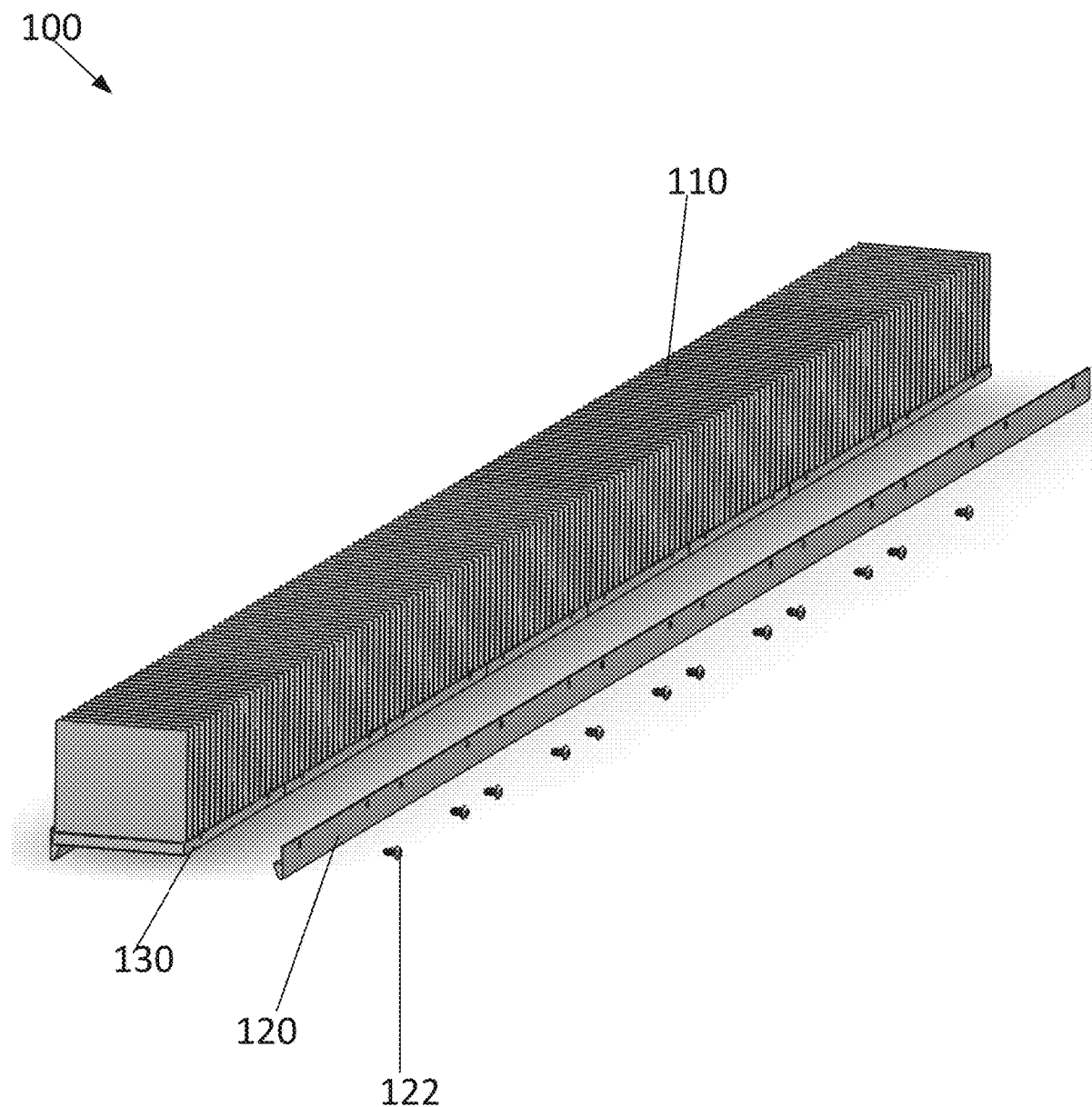
FIG. 2 depicts a cross flow heat sink, according to an embodiment.

FIG. 2 depicts a cross flow heat sink 100, according to an embodiment. Elements depicted in FIG. 2 may be described above. For the sake of brevity, an additional description of these elements is omitted.

As depicted in FIG. 2, base 130 may form a lower surface of fins 110, wherein base 130 may be simultaneously with fins 110 by inserting the unitary block of metal into the die. Therefore, a secondary operation may not be necessary to create a continuously planar base 130.

Furthermore, rails 120 may be affixed to base 130 via screws 122.

Figure 3:
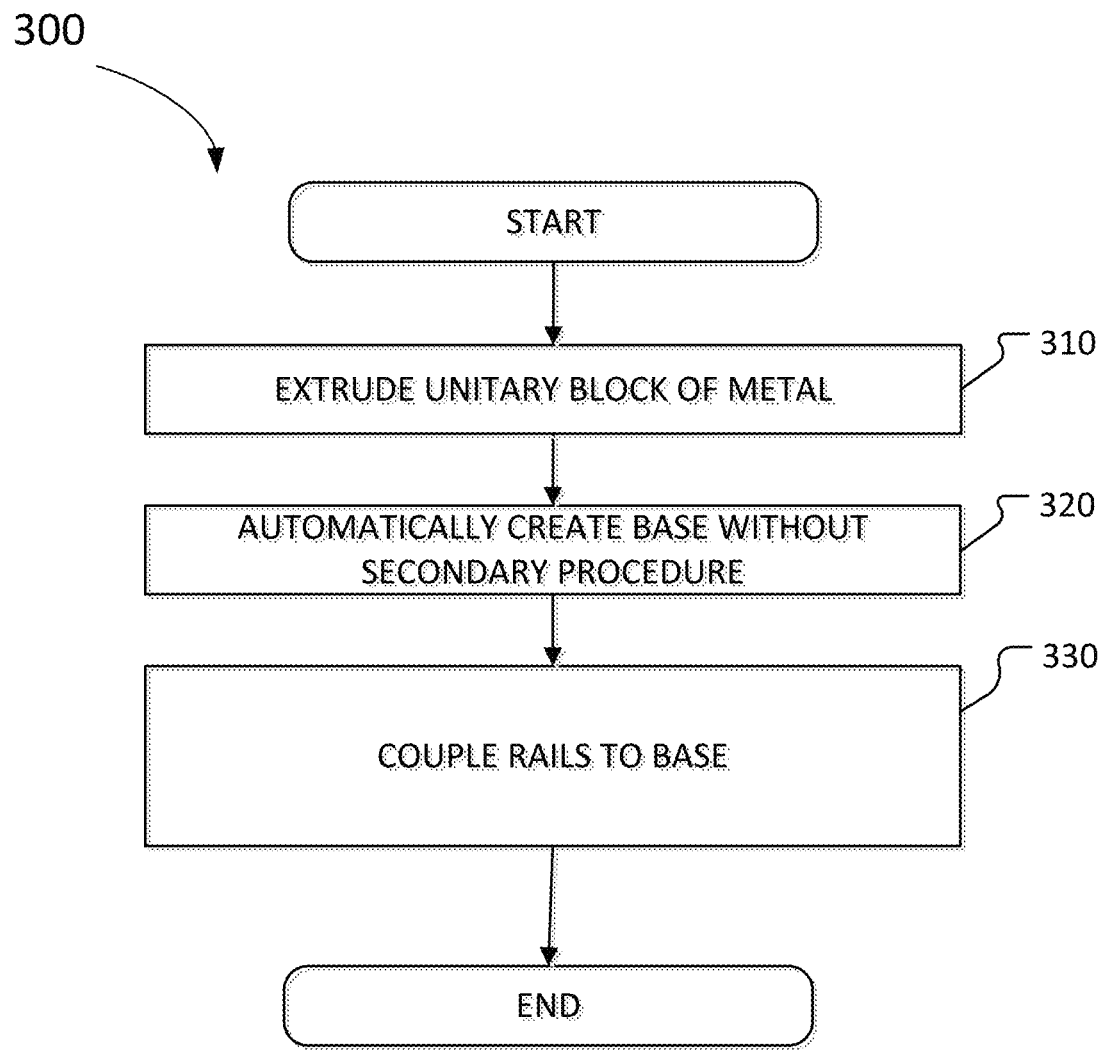
FIG. 3 depicts method of manufacturing a cross flow heat sink, according to an embodiment.

FIG. 3 illustrates a method 300 for manufacturing a heat sink, according to an embodiment. The operations of method 300 presented below are intended to be illustrative. In some embodiments, method 300 may be accomplished with one or more additional operations not described, and/or without one or more of the operations discussed. Additionally, the order in which the operations of method 300 are illustrated in FIG. 3 and described below is not intended to be limiting.

At operation 310, a block of metal may be inserted into a die. The may be utilized to cut or shape the block of metal to form fins and a base. The negative of the die may form a cross flow heat sink.

At operation 320, a base and fins may be simultaneously formed by operation 310, wherein the block of metal may be extruded to create a plurality of fins and the base. The extrusions may extend from an upper surface of the block of metal towards a lower surface of the block of metal, which is formed by the base. Additionally, the extrusions may occur across the width of the heat sink, which may create at least three exposed edges and a hollow chamber between adjacent.

At operation 330, rails may be coupled to the base via coupling mechanisms. The rails may have a first ends coupled to the outer sidewalls of the base, and second ends positioned underneath the base, wherein the second ends may not be directly coupled to the base. The rails may be utilized to couple multiple sections of extruded metal together to form a continuous heat sink.

Figure 4:
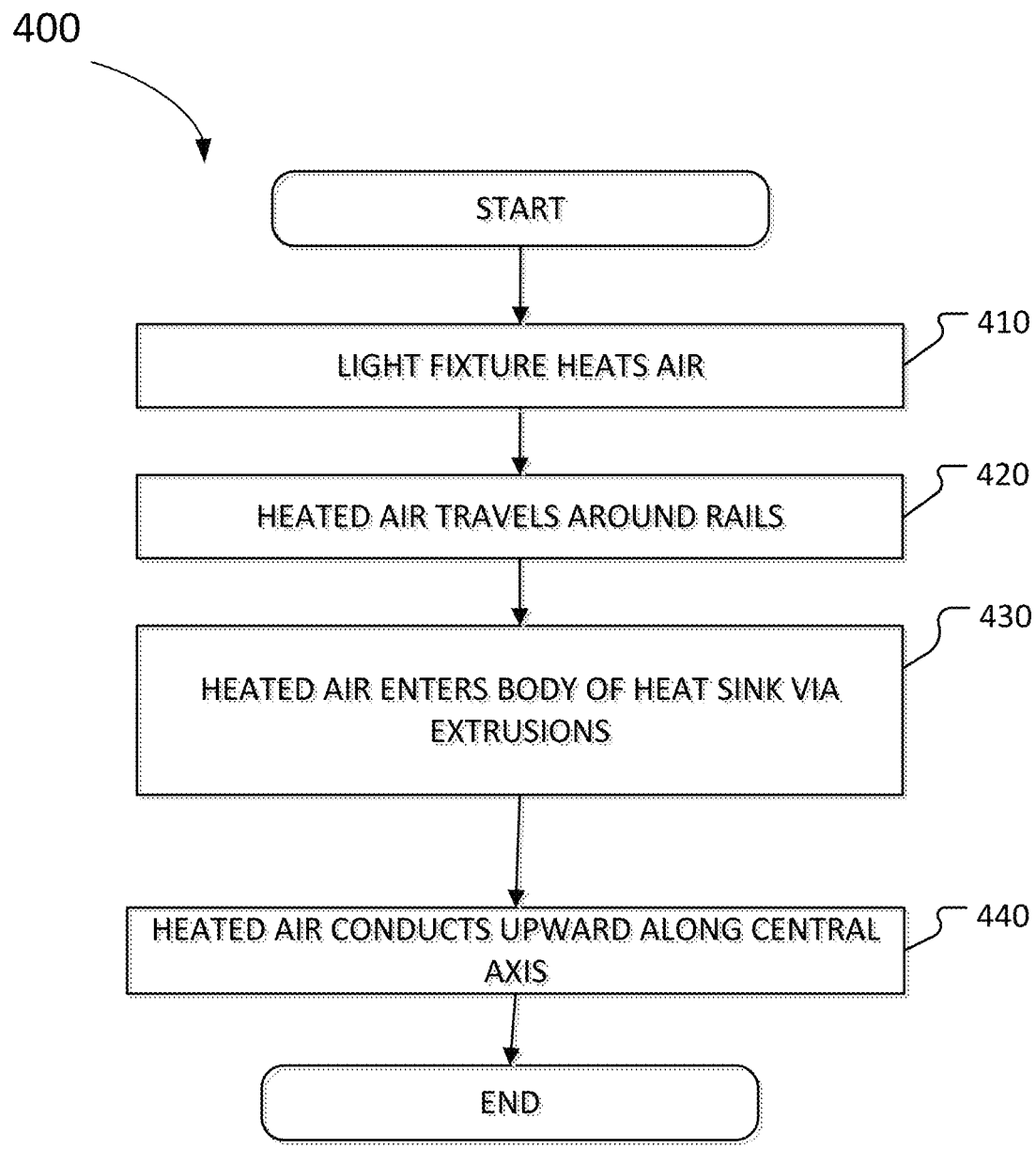
FIG. 4 depicts method of using a cross flow heat sink, according to an embodiment.

FIG. 4 illustrates a method 400 for utilizing a heat sink, according to an embodiment. The operations of method 400 presented below are intended to be illustrative. In some embodiments, method 400 may be accomplished with one or more additional operations not described, and/or without one or more of the operations discussed. Additionally, the order in which the operations of method 400 are illustrated in FIG. 4 and described below is not intended to be limiting.

At operation 410, air below a heat sink may be heated by a light fixture positioned directly below the heat sink.

At operation 420, the heated air may travel upward and around rails of the heat sink.

At operation 430, the heated air may travel into the body of the heat sink towards a central axis of the heat sink via extrusions on both sides of the heat sink between fins.

At operation 440, the heated air may conduct upward from a position proximate to the central axis of the heat sink above the light source, and away from the heat sink via extrusions between fins on the upper surface of the heat sink. Accordingly, as hot air rises, cooler air may be drawn into the heatsink. This process may cool the fins.

Figure 5:
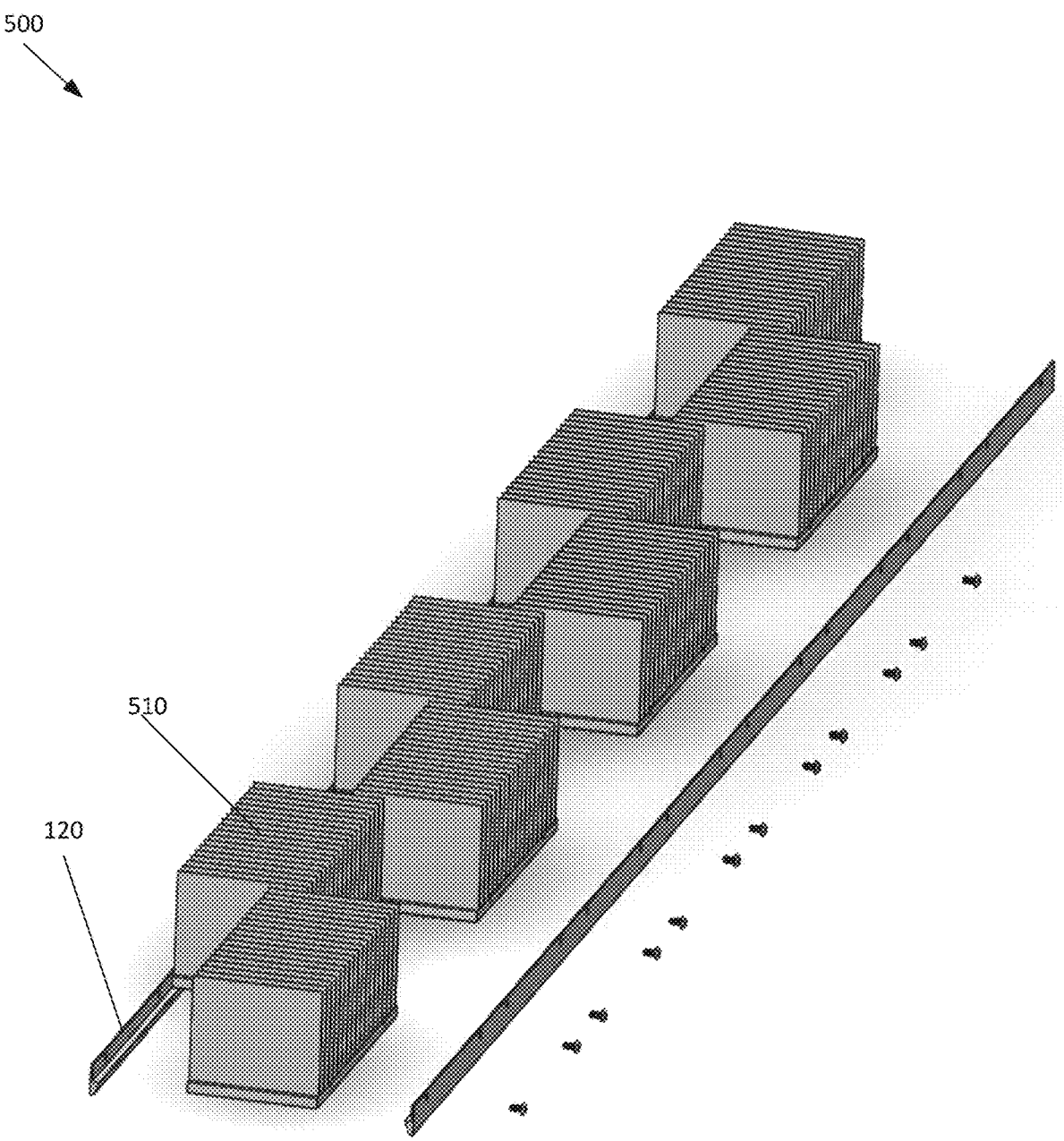
FIG. 5 depicts an unassembled cross flow heat sink, according to an embodiment.

FIG. 5 depicts an unassembled cross flow heat sink 500, according to an embodiment. As depicted in FIG. 5, cross flow heat sink 500 may be comprised of various sections 510 of fins, wherein sections 510 are coupled together along a longitudinal axis of heat sink 500 via rails 120. As such, the length of the heat sink may be based on the number of sections 510 of heat sink 500 that are positioned adjacent to each other.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. In addition, it is appreciated that the figures provided herewith are for explanation purposes to persons ordinarily skilled in the art and that the drawings are not necessarily drawn to scale.

The flowcharts and block diagrams in the flow diagrams illustrate the architecture, functionality, and operation of possible implementations of systems, methods, and computer program products according to various embodiments of the present invention. In this regard, each block in the flowcharts or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

What is claimed is:

1. A method for manufacturing a linear heat sink for a light source, comprising:
    creating a die to form the heat sink;
    forming a first plurality of fins by extruding a first unitary block of metal from an upper surface of the first unitary block of metal towards a lower surface of the first unitary block of metal via a negative of the die, wherein each of the plurality of fins includes an exposed upper edge;
    forming a first base simultaneously while forming the first plurality of fins;
    coupling a first rail to a first sidewall of a first base, the first base being positioned below the first plurality of fins,
    coupling a second rail to a second sidewall of the first base, the first rail and the second rail extending along a central axis of the linear heat sink from a first end of the first base to a second end of the first base, wherein:
        a width of each of the first plurality of fins extends across the central axis from the first rail to the second rail, the width of each of the first plurality of fins being smaller than a length of the linear heat sink;
        the first rail and the second rail each comprise a planar external sidewall perpendicular to the first base and a tapered internal sidewall, wherein the tapered internal sidewall extends outward from a position below the first base toward the planar external sidewall;
    extending a second unitary block of metal to form a second plurality of fins and a second base; and
    coupling the first base and the second base via the first rail and the second rail.

2. The method of claim 1, further comprising:
    creating at least three exposed surfaces between a first fin of the first plurality of fins and a second fin of the first plurality of fins.

3. The method of claim 1, wherein the first rail and the second rail are formed of a different material than the first unitary block of metal.

4. The method of claim 3, wherein the first rail and the second rail are formed of aluminum and the first unitary block of metal is an aluminum block.

5. The method of claim 1, further comprising:
    extruding an entire height of the first unitary block of metal to create four exposed edges between adjacent fins of the first plurality of fins.

6. The method of claim 1, wherein the extrusions are evenly spaced and uniformly shaped, the extrusions being perpendicular to the central axis.

7. The method of claim 6, wherein the extrusions are spaced $\frac{1}{3}^{rd}$ of an inch from each other.

8. The method of claim 1, further comprising:
    coupling first ends of the first rail and the second rail to an outer sidewall of the first base; and
    positioning second ends of the first rail and the second rail below the first base.

9. A linear heat sink for a light source comprising:
    a first plurality of fins formed by a negative of a die by extruding through the die a first unitary block of metal from an upper surface of the first unitary block of metal towards a lower surface of the first unitary block of metal, the extrusions causing spacing between each of the first plurality of fins, wherein each of the plurality of fins includes an exposed upper edge;

a first base that is formed simultaneously while forming the first plurality of fins;

a first rail being coupled to a first sidewall of a first base, the first base being positioned below the first plurality of fins;

a second rail being coupled to a second sidewall of the first base, the first rail and the second rail extending along a central axis of the linear heat sink from a first end of the first base to a second end of the first base, wherein:

a width of each of the first plurality of fins extends across the central axis from the first rail to the second rail, the width of each of the first plurality of fins being smaller than a length of the linear heat sink;

the first rail and the second rail each comprise a planar external sidewall perpendicular to the first base and a tapered internal sidewall, wherein the tapered internal sidewall extends outward from a position below the first base toward the planar external sidewall; a second plurality of fins formed by extruding a second unitary block of metal to form a second plurality of fins; and a second base associated with the second plurality of fins, wherein the first rail and the second rail are configured to couple the first base and the second base.

10. The heat sink of claim 9, wherein the extrusions create at least three exposed surfaces between a first fin of the first plurality of fins and a second fin of the first plurality of fins.

11. The heat sink of claim 9, wherein the first rail and the second rail are formed of a different material than the first unitary block of metal.

12. The heat sink of claim 11, wherein the first rail and the second rail are formed of aluminum and the first unitary block of metal is an aluminum block.

13. The heat sink of claim 9, wherein the extrusions extending across an entire height of the first unitary block of metal to create four exposed edges between adjacent fins of the first plurality of fins.

14. The heat sink of claim 9, wherein the extrusions are evenly spaced and uniformly shaped, the extrusions being perpendicular to the central axis.

15. The heat sink of claim 14, wherein the extrusions are spaced $\frac{1}{3}^{rd}$ of an inch from each other.

16. The heat sink of claim 9, wherein first ends of the first rail and the second rail are coupled to an outer sidewall of the first base, and second ends of the first rail and the second rail are positioned below the first base.

* * * * *